United States Patent [19]

Drees

[11] 3,709,424

[45] Jan. 9, 1973

[54] INTEGRATED CIRCUIT BONDER

[75] Inventor: Joseph M. Drees, Saratoga, Calif.

[73] Assignee: Signetics Corporation, Sunnyvale, Calif.

[22] Filed: Feb. 19, 1971

[21] Appl. No.: 116,896

[52] U.S. Cl. ....................228/44, 29/471.1, 29/589, 29/592, 29/624, 228/1, 228/4

[51] Int. Cl. ..........................................B23k 19/00

[58] Field of Search..........29/489, 470.1, 471.1, 592, 29/626, 627, 589, 624; 228/3, 1, 4, 5, 44, 47, 49; 219/85; 156/73

[56] References Cited

UNITED STATES PATENTS

| | | | |
|---|---|---|---|
| 3,400,448 | 9/1968 | Helda et al. | 228/3 X |
| 3,440,027 | 3/1969 | Hugle | 29/627 X |
| 3,442,432 | 5/1969 | Santangini | 228/44 |
| 3,452,917 | 7/1969 | Schneider | 228/49 |
| 3,465,408 | 9/1969 | Clark et al. | 228/5 X |

*Primary Examiner*—J. Spencer Overholser
*Assistant Examiner*—R. J. Craig
*Attorney*—Flehr, Hohbach, Test, Albritton & Herbert

[57] ABSTRACT

A bonder for sequentially bonding a plurality of semiconductor bodies carrying integrated circuits and having contact pads thereon to a respective plurality of lead structures formed in a sheet of material. The sheet of material is retained in a frame which is sequentially indexed to position each of the lead structures in a bonding position. Semiconductor bodies are picked up from storage by a pick up arm and placed on a transport arm. The transport arm is adapted to then shift to a bonding position whereby the semiconductor body on the transport arm is approximately coaxially aligned with the lead structure in the bonding position. Optical viewing apparatus is provided for viewing the lead structure in the bonding position and the semiconductor body retained on the transport arm in the bonding position. The transport arm is mounted on a micromanipulator apparatus by means of which the transport arm and hence the semiconductor body carried thereon may be rotated or translated in order to align the contact pads on the semiconductor body with the lead structure. A clamp is provided for clamping the lead structure to the semiconductor body after alignment and a bonding energy source such as a torch is moved into position to bond the semiconductor body to the lead structure.

17 Claims, 12 Drawing Figures

INVENTOR
JOSEPH M. DREES
BY Flehr, Hohbach, Test, Albritton & Herbert
ATTORNEYS

INVENTOR
JOSEPH M. DREES

BY Fehr, Hohbach, Test, Albritton & Herbert
ATTORNEYS

INVENTOR
JOSEPH M. DREES
BY Flehr, Hohbach, Test, Albritton & Herbert
ATTORNEYS

INVENTOR
JOSEPH M. DREES

BY

Fisher, Hohlbach, West, Albritton & Herbert
ATTORNEYS

INVENTOR
JOSEPH M. DREES
BY Fisher, Hohbach, Test, Albritton & Herbert
ATTORNEYS INVENTOR
JOSEPH M. DREES
BY Flehr, Hohbach, Test
Albritton & Herbert
ATTORNEYS INVENTOR
JOSEPH M. DREES
BY Fishe, Hohbach, Test, Albritton & Herbert
ATTORNEYS

INTEGRATED CIRCUIT BONDER

BACKGROUND OF THE INVENTION

This invention pertains to an integrated circuit bonder for bonding semiconductor bodies having integrated circuits and contact pads thereon to lead structures formed in a sheet of material.

In the manufacture of packaged integrated circuits, it is necessary that semiconductor bodies, which are of relatively small dimensions and which have electrical circuits formed therein according to techniques well known in the art, be connected in some manner to lead structures of relatively larger dimensions. Usually the semiconductor bodies together with portions of the lead structures are thereafter encapsulated in an insulating material to form packaged integrated circuits. It is important that individual handling of such packaged integrated circuits be minimized both in order to reduce cost and preserve the packaged integrated circuits from inadvertent handling damage.

In applicant's copending patent application entitled "Packaged Semiconductor Article And Method For Fabricating The Same", Ser. No. 93,092, filed Nov. 27, 1970, and assigned to the assignee of the present invention, there is disclosed a packaged semiconductor article and a method for fabricating the packaged semiconductor article which achieves the above objectives. Specifically, a plurality of lead structures are formed in a sheet of material with each of the lead structures generally comprising a plurality of spaced contact leads formed from the sheet and cantilevered inwardly toward a central opening to provide spaced inner contact areas. A semiconductor body having contact pads arranged thereon in a pattern matching that of the spaced inner contact areas is aligned with the lead structures and the spaced inner contact areas are bonded to the contact pads. The semiconductor body and a portion of the lead structures associated therewith are then encapsulated and the lead structures severed from the sheet to provide a plurality of discrete packaged integrated circuits each having leads with spaced apart extremities.

The present invention comprises a bonder and method for bonding the semiconductor bodies to the respective lead structures formed in the sheet of material.

SUMMARY OF THE INVENTION

Accordingly, it is an object of this invention to provide an improved bonder for bonding semiconductor bodies to lead structures.

It is a more specific object of this invention to provide an improved bonder for bonding a plurality of semiconductor bodies respectively to a plurality of lead structures formed in a sheet of material.

Briefly, in accordance with one embodiment of this invention, semiconductor bodies carrying integrated circuits and having a plurality of contact pads are picked up from a storage holder and placed on a transport means. The transport means is movable to a bonding position. A frame is provided for mounting a sheet of material having a plurality of lead structures therein and indexing means are provided for indexing the frame so that the sheet is indexed to sequentially register each of the lead structures in a bonding position. The bonding position of the storage means and hence the semiconductor body is generally coaxially aligned with the bonding position of the frame and sheet of material. Manipulator means are provided for rotating and translating the transport means and hence the semiconductor body so that the contact pads thereon are aligned with the lead structure. Clamping means then clamp the lead structure to the contact pads of the semiconductor body after alignment and bonding means are provided for bonding the contact pads of the semiconductor body to the lead structure.

DESCRIPTION OF THE PREFERRED EMBODIMENTS

Figures 1, 2:
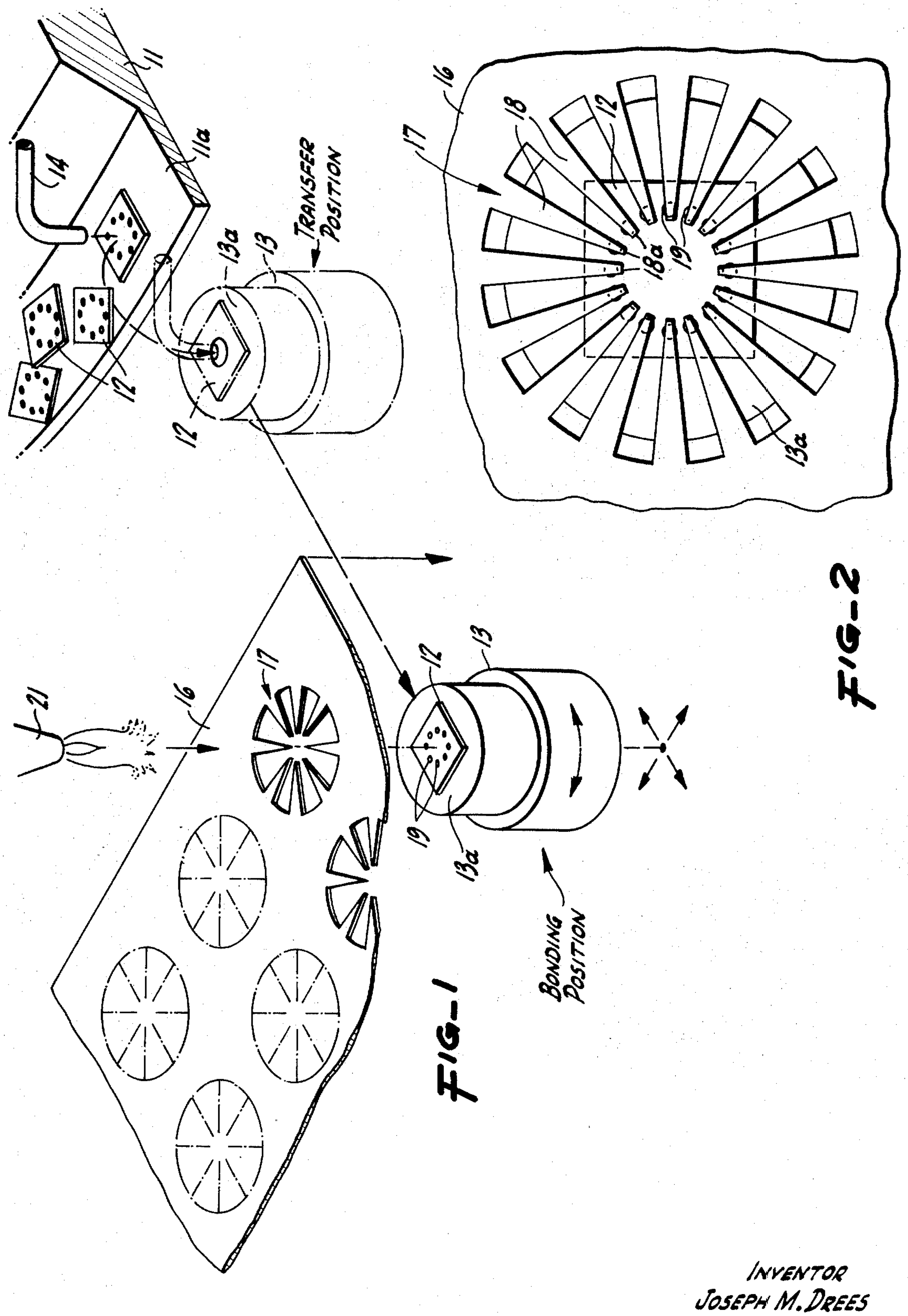
FIG. 1 is a diagrammatic drawing generally illustrating the major steps in bonding a semiconductor body to a lead structure in accordance with this invention.
FIG. 2 is a top plan view of one of the lead structures showing registration of contact pads on the semiconductor body therewith.

Referring now to FIGS. 1 and 2 storage means in the form of a rotatable storage disc 11 is provided for storing a plurality of semiconductor bodies. The rotatable storage disc 11 has an extended lip **11*a* on which a plurality of semiconductor bodies 12 are situated. Transport means in the form of a pedestal 13 is provided and is movable between a transfer position adjacent the extended lip 11*a* and a bonding position. Pickup means in the form of a vacuum pickup arm 14 is provided and is adapted to engage a semiconductor body 12 on the extended lip 11*a* by means of vacuum applied through the pickup arm 14 and to transfer the picked up semiconductor body to the top surface 13*a* of pedestal 13. The semiconductor body 12 is released by the vacuum pickup arm 14 when positioned on the top surface 13*a* of pedestal 13 by means of either turning the vacuum to the pickup arm 14 off or by having a vacuum line terminating in the top surface 13*a* of pedestal 13 which has a stronger vacuum applied thereto than is applied to the vacuum pickup arm 14. After the semiconductor body 12 is positioned on the top surface 13***a* and the pickup arm 14 is detached the pedestal 13 is moved from the transfer position to the bonding position.

A sheet of material 16 has a plurality of lead structures generally indicated by reference numeral 17 formed therein. Each of the lead structures 17 comprises a plurality of cantilevered members 18 formed from the sheet of material 16 and extending inwardly to terminate in spaced inner contact areas 18*a*. The spaced inner contact areas 18*a* are arranged in a pattern corresponding to a pattern of contact pads 19 on one of the semiconductor bodies 12. Frame means are provided for holding the sheet of material 16 and indexing means are provided for indexing the frame means and hence the sheet of material 16 such that each of the lead structures 17 is sequentially indexed to a bonding position in which that lead structure is approximately coaxially aligned with a semiconductor body 12 retained on the top surface 13*a* of the pedestal 13 when the pedestal 13 is in the bonding position. Manipulator means are provided for rotating and/or translating the pedestal 13 so that the contact pads 19 of a semiconductor body 12 carried on the top surface 13*a* of pedestal 13 are exactly aligned with the spaced inner contact areas 18*a*. Clamping means is provided for clamping the aligned spaced inner contact areas 18*a* to the contact pads 19 and bonding means 21 is provided for bonding the spaced inner contact areas 18*a* to the contact pads 19 of semiconductor body 12. Bonding means 21 can comprise any of the well known bonding devices and methods well known in the integrated circuit art. For example, the contact pads 19 may be soldered-coated with the bonding means 21 comprising a torch. Alternatively, bonding means 21 may comprise an ultra-sonic transducer.

After bonding is completed, the bonding means 21 is withdrawn, the clamping means releases the lead structure and the semiconductor body 12 is attached to and held by the lead structure 17 through the bonds formed between the contact pads 19 and the spaced inner contact areas 18*a*. The sheet 16 is then indexed so as to properly position another of the lead structures 17. The pedestal 13 is moved to the transfer position and another semiconductor body transferred thereon. The pedestal 13 is then moved to the bonding position, with alignment of the contact pads to the spaced inner contact areas occurring again followed by bonding, and so on until a semiconductor body is attached to each of the lead structures in the sheet of material.

Figure 3:
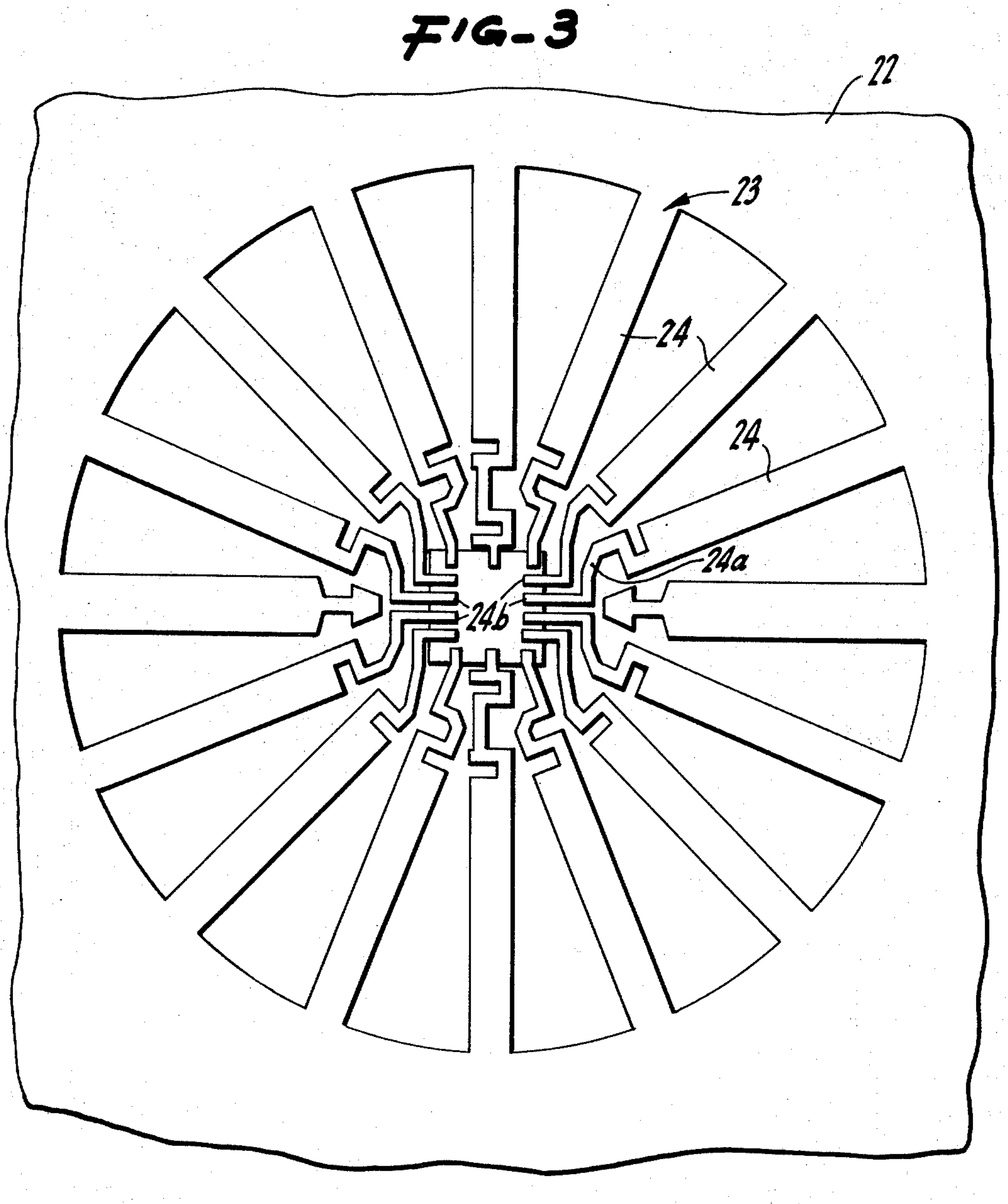
FIG. 3 is a top plan view similar to FIG. 2 and illustrating registration of contact pads on a semiconductor body with inner contact areas of a lead structure having convoluted portions.

Referring now to FIG. 3, there is shown a top plan view similar to FIG. 2 but showing a different form of lead structure in which portions of the lead structure are convoluted in accordance with the teachings of applicant's invention as disclosed in copending application Ser. No. 93,092. In FIG. 2 a sheet of material 22 has a plurality of lead structures generally indicated by reference numeral 23 formed therein. Each of the lead structures 23 comprises a plurality of inwardly extending cantilevered members 24 formed from the sheet of material. The cantilevered members 24 have convoluted portions generally indicated by reference numeral 24*a* and terminate in spaced inner contact areas 24*b*. As before, a semiconductor body 12 has a plurality of contact pads 19 thereon which are adapted to be aligned with and bonded to the spaced inner contact areas 24*b*.

Figure 4:
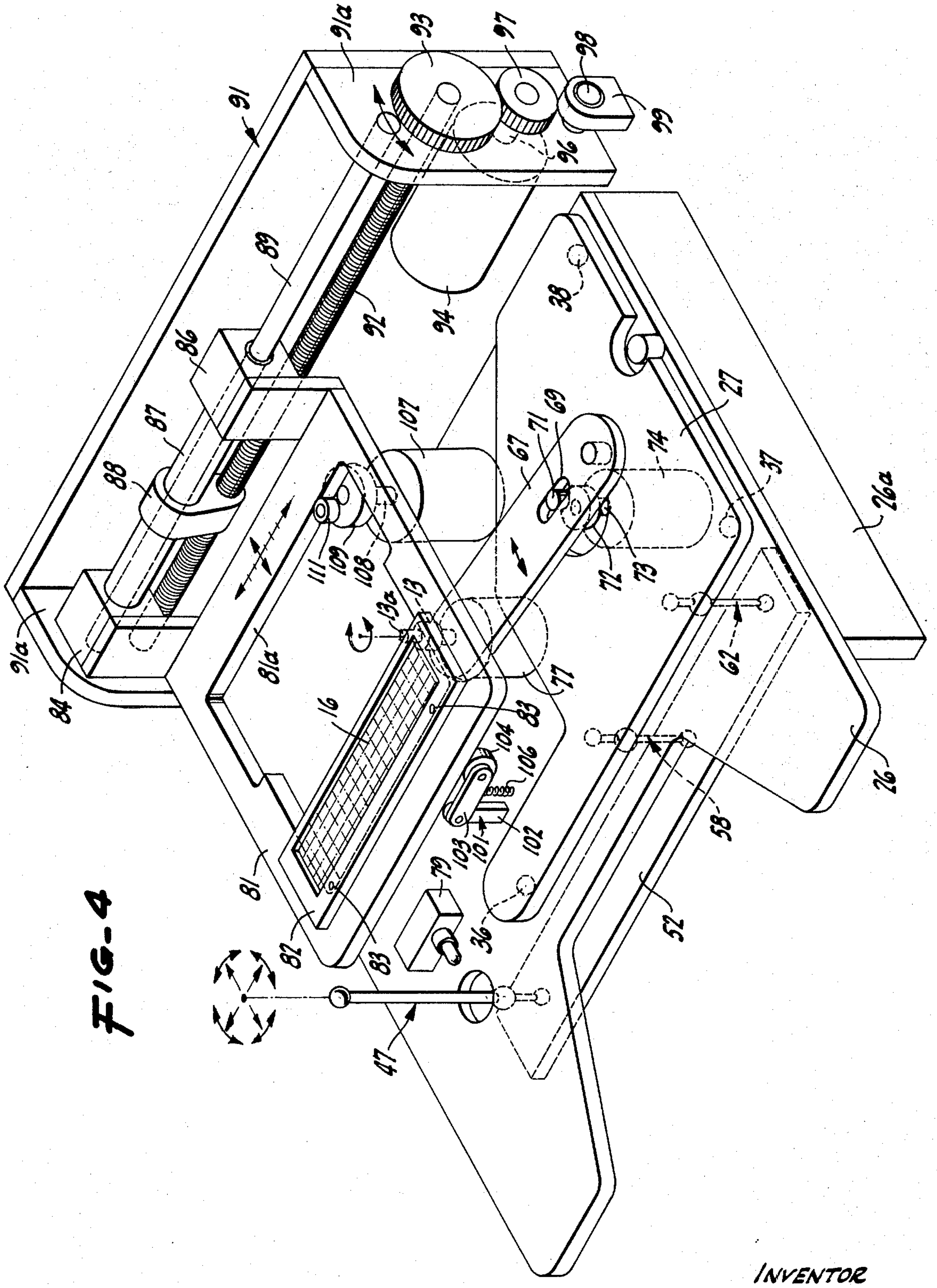
FIG. 4 is an isometric view of the bonder with the upper support table and the elements carried thereon removed for clarity.
Figures 5A, 5B:
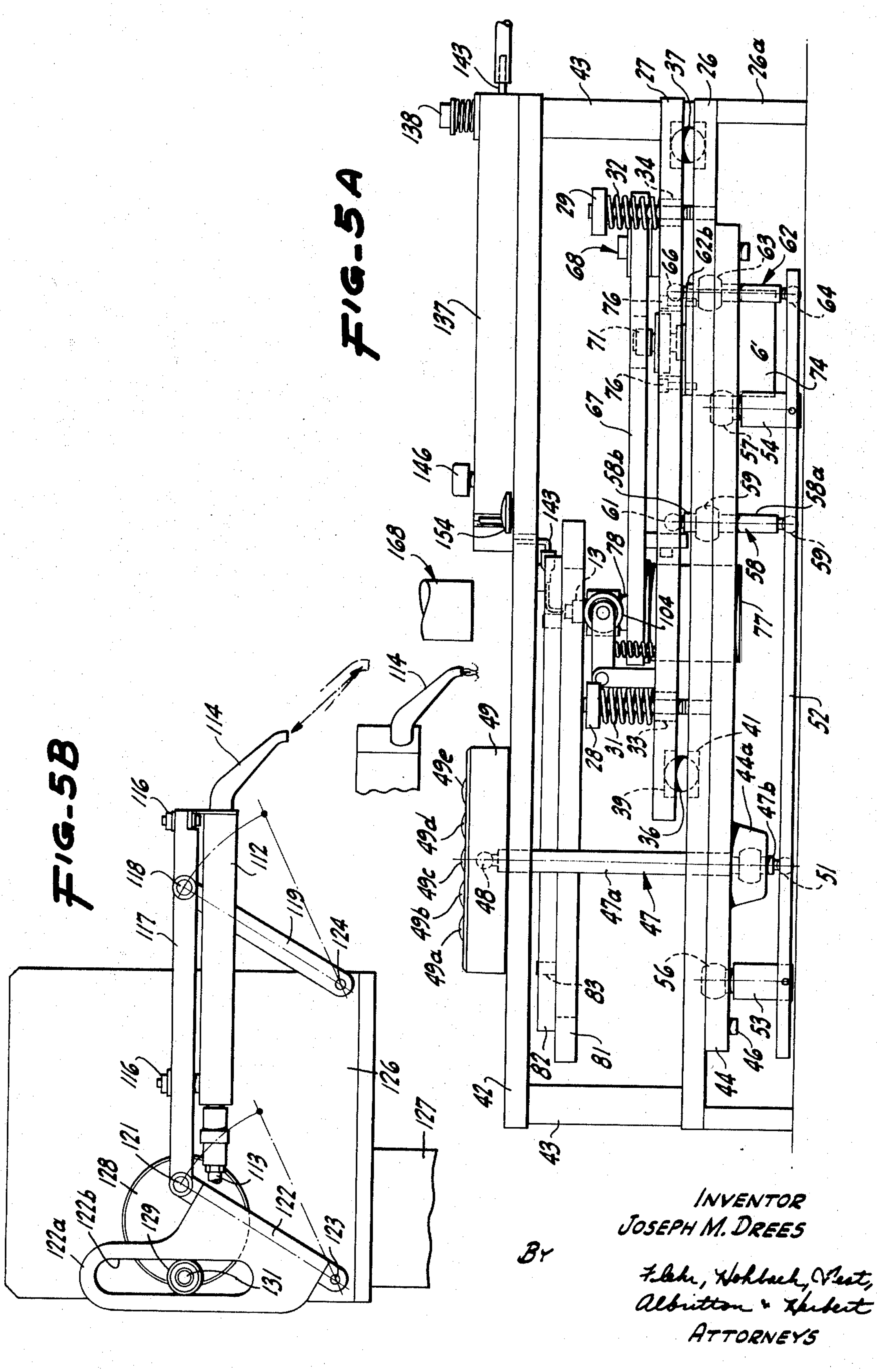
FIG. 5A is a front elevation of the bonder.
FIG. 5B is a front elevation of the bonding torch.
Figure 6:
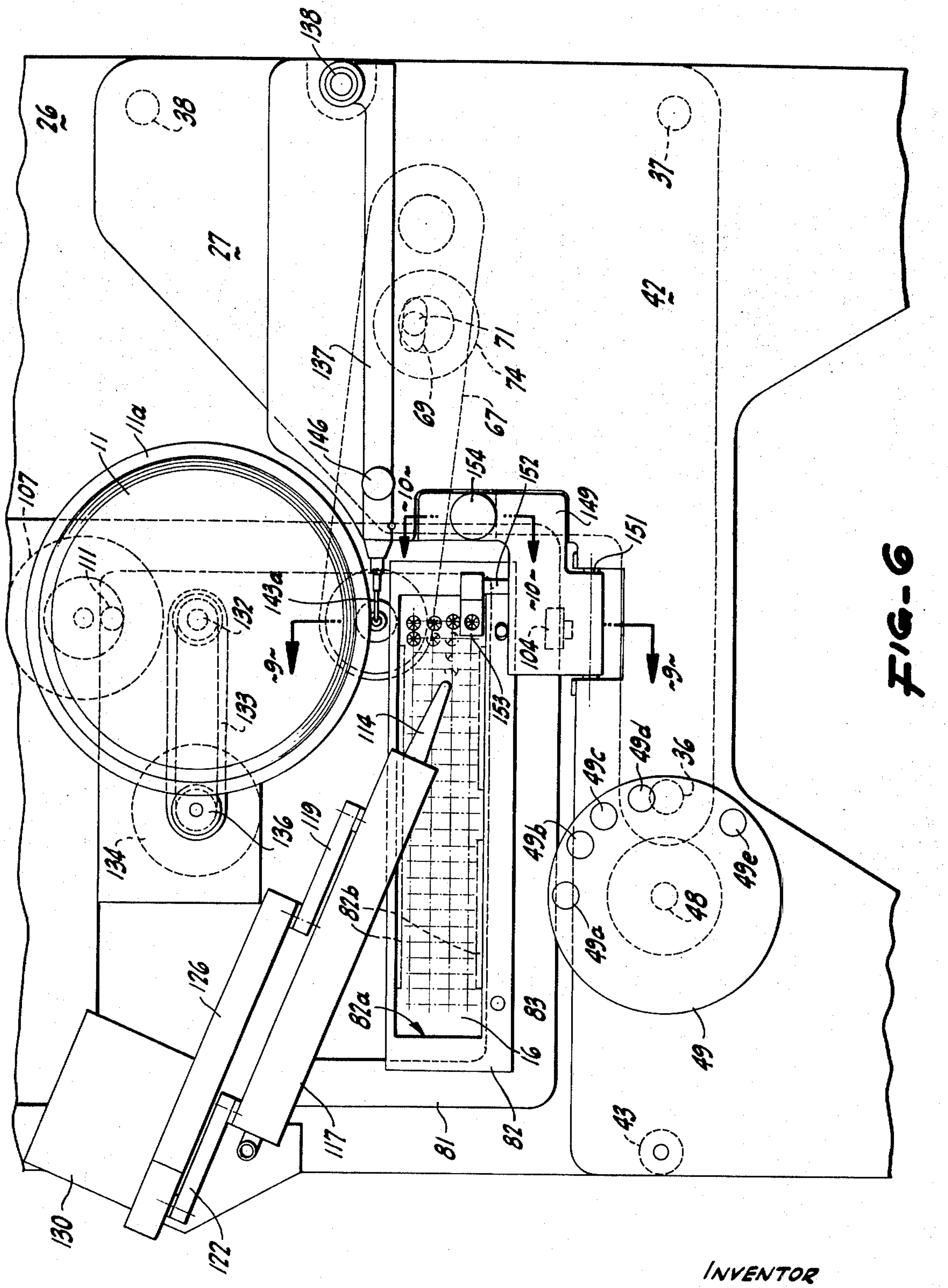
FIG. 6 is a top plan view of the bonder showing the upper support table, bonding torch and rotatable storage disc in place.

Referring now to FIGS. 4 through 6, there is shown details of a bonder in accordance with this invention. The bonder generally comprises a lower support table 26 having base portions 26*a*. A micropositioner table 27 is mounted to the lower support table by means such as screws 28 and 29 with their associated springs 31 and 32. The screws 28 and 29 extend through enlarged openings 33 and 34 in the micropositioner table 27 and are threadedly engaged in the lower support table 26. The micropositioner table 27 is held in spaced relationship from the lower support table 26 by three ball bearing assemblies 36, 37 and 38. These ball bearing assemblies are each retained in enlarged cavities 39 in the micropositioner table 27 and matching enlarged cavities 41 in the lower support table 26. This ball bearing support arrangement permits translational movement of the micropositioner table 27 with respect to the lower support table 26.

Movement of the micropositioner table 27 with respect to the lower support table 26 is controlled by a micropositioning apparatus. An upper support table 42 is mounted to the lower support table 26 by means such as upstanding end members 43. The lower support member 26 has an additional lower support 44 attached thereto by means such as screws 46. The additional lower support 44 has an extended portion 44*a* in which is universally mounted a joy stick 47. The joy stick 47 has a relatively long lever arm 47*a* which extends through the lower support 26 and the upper support table 42 and is mounted by means of a ball joint 48 to a position control operator 49 adapted for sliding movement on the upper support table 42. The control operator 49 has a series of pushbuttons 49*a* through 49*e* mounted thereon. The joy stick 47 also has a relatively short lever arm 47*b* which is mounted by means of a ball joint 51 to a movable bar 52. The movable bar 52 is carried by pivoting members 53 and 54 which are respectively mounted in universal joints 56 and 57 in the lower supports 26 and 44 for universal movement with respect thereto. A joy stick 58 is mounted by means of a universal joint 59 in the lower support members 26 and 44 and has a relatively long lever arm 58*a* which is mounted by means of a ball joint 59 in the movable bar 52. The joy stick 58 also has a relatively short lever arm 58*b* which is mounted by means of a ball joint 61 in the micropositioner table 27. Similarly, a joy stick 62 is mounted by means of a universal joint 63 in the lower supports 26 and 44 and has a relatively long lever arm 62*a* mounted by means of a ball joint 64 to the movable bar 52. The joy stick 62 also has a relatively short lever arm 62*b* which is mounted by means of a ball joint 66 in the micropositioner table 27. With this arrangement, relatively large translational movements of the position control operator 49 are translated into relatively small movements of the movable bar 52. These relatively small movements of the movable bar 52 are translated by the joy sticks 58 and 62 into even smaller movements of the micropositioner table 27.

The micropositioner table 27 has a transport arm 67 pivotally mounted thereto by means such as pivot assembly 68. The transport arm 67 has an elongated opening 69 therein for receiving a locating pin 71 eccentrically mounted on a pulley 72. The pulley 72 is suitably attached to a shaft 73 of a motor 74. The motor 74 is suitably rigidly affixed to the micropositioner table 27 by means such as screws 76.

An additional motor 77 is suitably rigidly attached to the transport arm 67 and has a motor shaft 78 to which a pedestal 13 having a top surface 13*a* is secured. Operation of the motor 74 and hence movement of the transport arm 67 is controlled by a microswitch 79 which is adapted to be contacted by and actuated by the joy stick 47 when it is in its extreme forward position.

An indexing frame 81 has a sheet-retaining frame 82 suitably attached thereto such as by screws 83. The sheet-retaining frame 82 has an inner periphery 82*a* for receiving a sheet of material having a plurality of lead structures formed therein and the sheet retaining frame 82 includes ledges 82*b* for supporting such a sheet of material.

The indexing frame 81 has a pair of upstanding blocks 84 and 86 mounted thereto. A tubular member 87 is intricately mounted to the blocks 84 and 86 and a screw follower member 88 is intricately mounted to the tubular member 87. The combination of the upstanding blocks 84 and 86, the tubular member 87 and the screw follower member 88 are mounted on a shaft 89 and are adapted for sliding movement with respect thereto. The shaft 89 is mounted in end members 91*a* of the frame 91. A screw shaft 92 is also mounted in the frame 91 and has a gear 93 attached to one end thereof. The screw shaft 92 extends through and threadedly engages the screw follower member 88. A motor 94 having a shaft 96 to which a gear 97 is suitably attached is also mounted to the frame 91. The gear 97 engages and drives the gear 93. The entire frame 91 together with all the components mounted to the frame 91 are pivotally mounted by means of a pivot assembly 98 to a stationary base member 99. The indexing frame 81 is also supported by a support assembly 101 which comprises a base 102 to which is pivotally mounted an arm 103 having a roller 104 pivotally mounted thereto for contacting and supporting the indexing frame 81. A spring 106 is provided for yieldably urging the arm 103 and hence the roller 104 in an upward direction.

A motor 107 is provided having a shaft 108 to which a pulley 109 is suitably attached. The pulley 109 has a roller member 111 suitably attached thereto and eccentrically mounted thereto. The roller member 111 is adapted to contact the inner periphery 81*a* of the indexing frame 81.

Bonding means in the form of a torch 112 is provided. The torch 112 has a gas inlet 113 and a nozzle 114. The torch 112 is suitably mounted by means such as screw assemblies 116 to a link member 117. The link member 117 is pivotally connected by means of pivot assembly 118 to another link member 119. Similarly, the link member 117 is connected by means of another pivot assembly 121 to a link member 122 which has an extended portion 122*a* having an elongated opening 122*b* therein. The link members 119 and 122 are suitably secured such as by pivots 123 and 124 to a torch support plate 126 which is rigidly supported by a base 127. Motor means 130 is mounted to the torch support plate 126 and has a pulley 128 suitably attached to the shaft thereof. A roller member 129 is eccentrically mounted to the pulley 128 by means such as pivot assembly 131 and the roller member 129 is captured by and retained in the elongated opening 122*b* of link member 122.

Semiconductor storage means is provided in the form of the rotatable storage disc 11 having an extended lip 11*a*. The rotatable storage disc 11 is suitably rotatably mounted such as by bearing post assembly 132 to the lower support table 26 and is driven by suitable means such as belt 133. Belt 133 is driven by a motor 134 having a pulley 136 around which the belt 133 extends.

Figure 7:
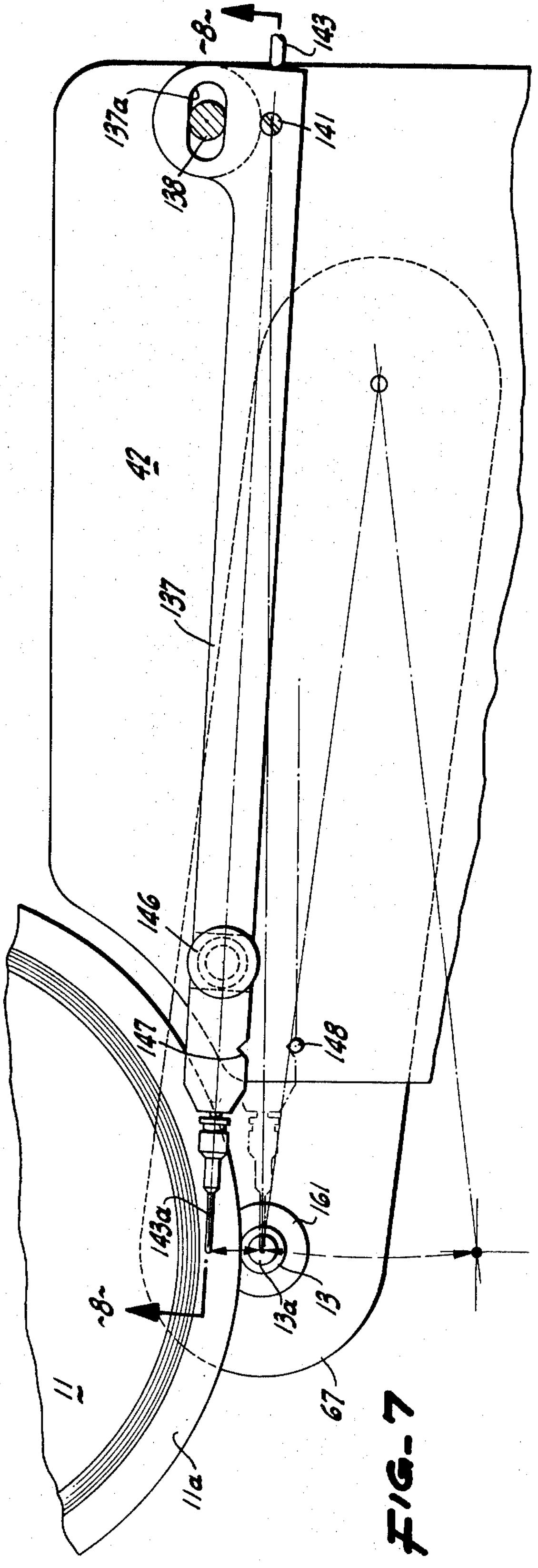
FIG. 7 is a detail of the pickup arm of the bonder illustrating the manner in which semiconductor bodies are transferred from the rotatable storage disc to the transport arm.
Figure 8:
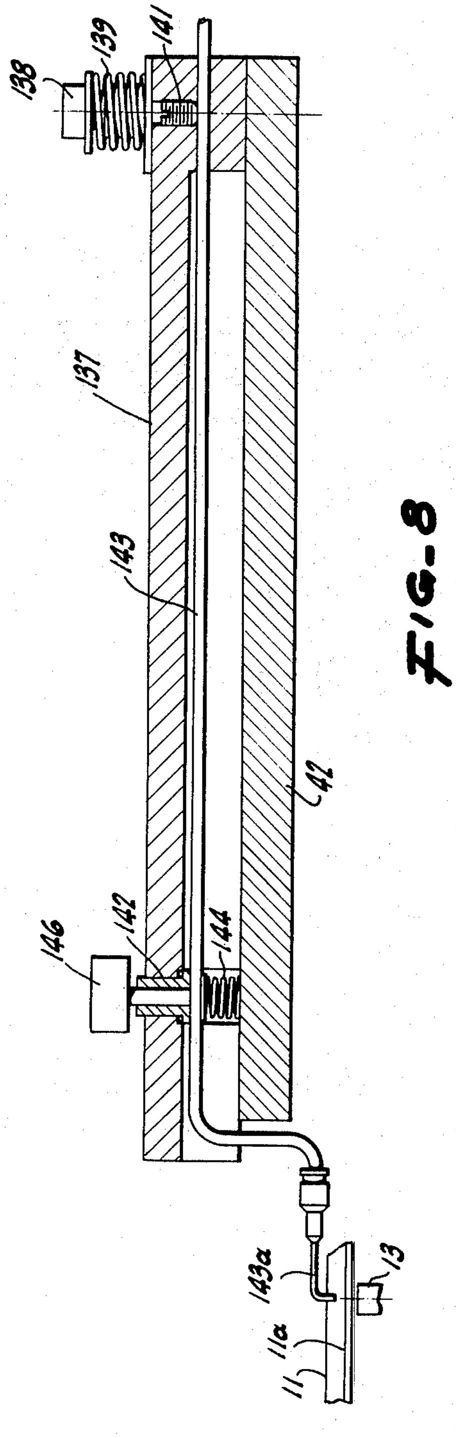
FIG. 8 is a sectional view of the pickup arm taken along the line 8—8 in FIG. 7.
Figures 9, 10, 11:
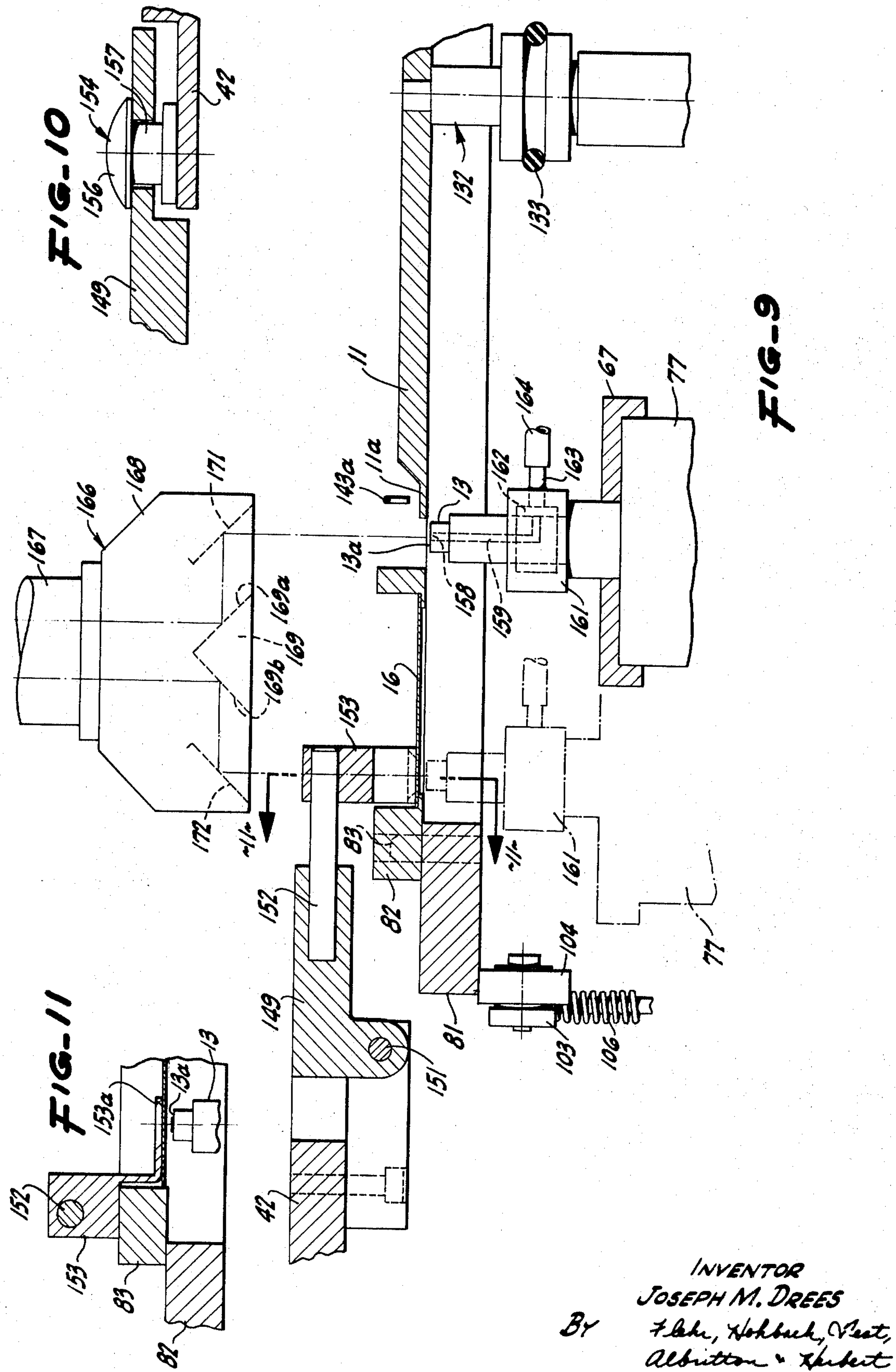
FIG. 9 is a sectional view of the clamping arrangement of the bonder and including a portion of the viewing optics taken along the line 9—9 in FIG. 6.
FIG. 10 is another sectional view of the clamping arrangement taken along the line 10—10 in FIG. 6.
FIG. 11 is another sectional view of a portion of the clamping arrangement taken along the line 11—11 in FIG. 6.

Pickup arm means is provided for transferring semiconductor bodies from the rotatable storage disc 11 to the top surface 13*a* of pedestal 13. Details of the pickup arm means may be seen in FIGS. 7 and 8. A pickup arm frame 137 has an elongated opening 137*a* through which a screw 138 extends. Screw 138 threadedly engages the upper support table 42 and a biasing spring 139 yieldably urges the pickup arm frame 137 against the upper support table 42. The pickup arm frame 137 has a set screw 141 and an apertured locating member 142 for mounting a vacuum pickup tube 143. The vacuum pickup tube 143 has a nozzle portion 143*a* which is adapted to pick up semiconductor bodies from the extended lip 11*a* of the rotatable storage disc 11 and transfer them to the top surface 13*a* of pedestal 13. A spring 144 normally biases the vacuum pickup tube 143 upward so that the nozzle portion 143*a* is spaced some distance above the extended lip 11*a*. A button actuator 146 is provided which has a shaft portion 146*a* extending into the apertured locating member 142 and contacting the vacuum pickup tube 143. When the button actuator 146 is depressed the vacuum pickup tube 143 is forced downward against the spring biasing of spring 144 so that the nozzle portion 143*a* of the vacuum pickup tube 143 contacts a semiconductor body resting on the extended lip 11*a* of rotatable storage disc 11. The pickup arm frame 137 has a V-shaped notch 147 which is adapted to cooperate with a locating pin 148 fixedly mounted in the upper support table 42. When the pickup arm frame 137 is positioned so that the locating pin 148 is captured in the V-shaped notch 147 nozzle portion 143*a* of vacuum pickup arm 143 is positioned directly over the top surface 13*a* of pedestal 13.

Clamping means is provided for clamping the sheet of material 16 and in particular one of the lead structures formed therein to a semiconductor body carried on the top surface 13*a* of the pedestal 13 when the pedestal 13 is in the bonding position. A hinged plate 149 is suitably rotatably mounted to the upper support table 42 by means such as pivot shaft 151. A tubular pin 152 is fixedly mounted to the hinged plate 149 and an L-shaped clamping member 153 is fixedly mounted to the tubular pin 152. The L-shaped clamping member 153 includes a tapered apertured portion generally indicated by reference numeral 153*a*. The tapered aperture 153*a* is slightly larger than one of the lead structures in the sheet of material and is adapted to contact the sheet of material surrounding one of the lead structures in order to clamp the sheet of material and the lead structure against a semiconductor body carried on the top surface 13*a* of pedestal 13. Clamping actuator means in the form of a spring loaded pushbutton assembly 154 is provided for causing the L-shaped clamping member to contact the sheet of material and clamp it against a semiconductor body held on the top surface 13*a* of pedestal 13. The spring loaded pushbutton assembly 154 is mounted to the upper support table 42 and includes a button 156 having an operating shaft 157 which is spring loaded and which extends through an aperture in the hinged plate 149. Depression of the button 156 overcomes the internal spring biasing within the operating shaft 157 to cause the hinged plate 149 to be pivoted downward whereby the tapered apertured portion 153*a* of the L-shaped clamping member 153 engages the sheet of material 16 to clamp a portion of it including a lead structure to a semiconductor body retained on the top surface 13*a* of pedestal 13.

The top surface 13*a* of pedestal 13 has an opening 158 which communicates with a vacuum line 159 extending through the interior of the pedestal 13. A collar member 161 has a hollow interior which together with the pedestal 13 define a vacuum chamber generally indicated by reference numeral 162. The vacuum chamber 162 is in constant communication with the vacuum line 159 as the pedestal 13 rotates. The collar member 161 has a vacuum inlet 163 which may be connected with a vacuum line 164 from a suitable source of vacuum.

Viewing means generally indicated by reference numeral 166 is provided for facilitating pickup, alignment and bonding of semiconductor bodies to lead structures. Viewing means 166 comprises a typical binocular microscope arrangement (not shown) whose field of view is optically coupled through an annular housing 167 into a housing 168. The housing 168 encloses split field viewing optics which comprises a triangular shaped reflecting mirror 169 having reflecting surfaces 169*a* and 169*b*. Flat reflecting mirrors 171 and 172 are also provided. The flat reflecting mirror 171 is disposed at approximately 45° with respect to a vertical line of sight along the axis of the pedestal 13 when the pedestal 13 is in the transfer position adjacent the rotatable storage disc 11. Thus, a view of the top surface 13*a* of pedestal 13 and the extended lip 11*a* of rotatable storage disc 11 is reflected by the flat reflecting mirror 171 and the reflecting surface 169*a* up through the annular housing 167 to conventional binocular viewing optics. The flat reflecting mirror 172 is disposed at approximately 45° with respect to the vertical axis of the pedestal 13 when the pedestal 13 is in the bonding position underneath a lead structure in the sheet of material 16. Thus, a view of the lead structure on sheet of material 16 and a semiconductor body on top surface 13*a* of pedestal 13 in the bonding position is reflected by flat reflecting mirror 172 and reflecting surface 169*b* up through the annular housing 167 to the conventional binocular viewing optics. Thus, an observer looking into the conventional binocular viewing optics sees a split field, with half of the field showing the top surface 13*a* of pedestal 13 and the extended lip 11*a* of rotatable storage disc 11 (assuming that the pedestal 13 is in the transfer position). The other half of the field shows a lead structure on the sheet of material 16 with underneath the lead structure the top surface 13*a* of the pedestal 13 with a semiconductor body thereon (assuming that the pedestal 13 is in the bonding position).

In operation, and in accordance with the method of this in invention, a sheet of material 16 having a plurality of lead structures 17 formed therein is placed in the sheet retaining frame 82. The motor 94 and the motor 107 are actuated to position the indexing frame 81 to an initial position in which one of the lead structures 17 in the top right hand corner of the sheet of material 16 is positioned at a bonding location. The joy stick 47 is then pushed all the way forward to actuate the microswitch 79 which turns on the motor 74. Rotation of the shaft 73 of motor 74 is coupled through the locating pin 71 to the transport arm 67 and causes the transport arm 67 to swing forward so that the motor 77 along with pedestal 13 is moved forward to a transfer position in which the pedestal 13 is adjacent the extended lip 11*a* of the rotatable storage disc 11. A plurality of semiconductor bodies are disposed along the extended lip 11*a* of the rotatable storage disc 11 and the motor 134 by means of belt 133 slowly rotates the rotatable storage disc 11.

Next, the pickup arm frame 137 along with the vacuum pickup tube 143 is manually manipulated until the nozzle portion 143*a* is directly above one of the semiconductor bodies on the extended lip 11*a*. Proper positioning of the nozzle portion 143*a* with respect to a semiconductor body which is to be picked up is confirmed by an operator looking through the viewing means 166. When such proper positioning is established, the button actuator 146 is depressed so that the nozzle portion 143*a* contacts the semiconductor body and due to the vacuum applied thereto picks it up. Then the pickup arm frame 137 is positioned so that the V-shaped notch 147 therein encloses the locating pin 148. In this position, the nozzle portion 143*a* which it will be recalled is retaining a semiconductor body, is directly positioned above the top surface 13*a* of pedestal 13 with the pedestal 13 in the transfer position. The button actuator 146 is again depressed so that the semiconductor body is moved down to the top surface 13*a*. The vacuum applied through vacuum line 159 in pedestal 13 is somewhat stronger than the vacuum applied to the vacuum pickup tube 143 so that the top surface 13*a* captures the semiconductor body. The joy stick 47 is then moved to a central position so that it releases the microswitch 79. When microswitch 79 is released the motor 74 is actuated to rotate its shaft 73 which motion is coupled through the locating pin 71 to the transport arm 67 and the transport arm moves to a bonding position moving with it the motor 77 and pedestal 13 with the semiconductor body retained on the top surface 13*a* thereof.

The next procedure is alignment of the semiconductor body on the top surface 13*a* so that the contact pads on the semiconductor body are aligned with elements of the lead structure in the bonding position. Alignment is achieved by operation of the position control operator 49 in conjunction with the pushbuttons 49*a* through 49*d* situated thereon. Movement of the position control operator 49 on the upper support table 42 moves the joy stick 47 which motion is coupled through the joy sticks 58 and 62 into movement of the micropositioner table 27 and hence the transport arm 67 and pedestal 13. The pushbuttons 49*a* through 49*d* control operation of the motor 77 which serves to rotate the pedestal 13 and hence a semiconductor body carried thereon.

For example, pushbutton 49*a* rotates the pedestal 13 rapidly in a clockwise direction; pushbutton 49*b* rotates the pedestal 13 slowly in a clockwise direction; pushbutton 49*c* rotates the pedestal 13 rapidly in a counterclockwise direction; and pushbutton 49*d* rotates the pedestal 13 slowly in a counterclockwise direction. Thus through the use of the pushbuttons 49 *a* through 49*d* and movement of the position control operator 49, an operator which is viewing a lead structure which is to be bonded and through the lead structure viewing the semiconductor body held on the top surface 13*a* of pedestal 13 underneath the lead structure can exactly align the contact pads on the semiconductor body with elements of the lead structure. When this alignment has been completed, the button 156 on spring loaded pushbutton assembly 154 is depressed to cause the L-shaped clamping member 153 to engage the sheet of material surrounding lead structure and clamp it against the semiconductor body held on the top surface 13*a* of pedestal 13. Then an operator depresses the pushbutton 49*e* carried on the position control operator 49 which actuates the motor 130. Actuation of the motor 130 rotates the pulley 128 and causes the link member 122 to move to the right and downward so that the torch 112 is moved to the right and downward and the nozzle 114 of torch 112 comes to a position immediately above the lead structure which is to be bonded to the semiconductor body contact pads and applies heat thereto for melting, for example, a solder coating which is present on the semiconductor body contact pads. The duration of the application of a bonding heat is controlled by suitable timing means (not shown). After bonding is completed the torch 112 is withdrawn back to its original position.

To attach the next semiconductor body to a lead structure the first thing that happens is that the position control operator 49 is again moved to an extreme forward position whereby the microswitch 49 is actuated. Actuation of the microswitch 79 turns on the motor 74 which by means of eccentrically mounted pin 71 swings the transport arm 67 to a rearward position whereby the pedestal 13 is again in a transfer position adjacent the rotatable storage disc 11. At the same time, actuation of the microswitch 79 causes through suitable control circuitry the motor 94 to be actuated to rotate gear 97. Rotation of gear 97 rotates gear 93 and hence the screw shafts 92 to index the upstanding blocks 84 and 86 and hence the indexing frame 81 and sheet retaining frame 82. The motor 94 is operated for just a sufficient time to position the next of the lead structures in the sheet of material 16 over the bonding position of the pedestal 13. Then the position control operator 49 is moved back to a central position to release the microswitch 79 and the transport arm 67 is swung back so that pedestal 13 (to which has been transferred a semiconductor body as before while in the transfer position) is returned to the bonding position. Then alignment of the semiconductor body so that its contact pads are in alignment with portions of the lead structure in the bonding position proceeds as before and when alignment has been achieved bonding proceeds as before.

This sequence of events continues occurring until the indexing frame 81 and hence the sheet retaining frame 82 has been indexed all the way across the screw shaft 92 with a semiconductor body being bonded to each of the lead structures in a single row in the sheet of material 16. After all of the lead structures in a single row have semiconductor bodies bonded thereto the indexing frame 81 and the sheet retaining frame 82 are indexed all the way back to their original position. At the same time that this indexing back to the original position is taking place the motor 107 is also actuated to index the indexing frame 81 and hence the sheet retaining frame 82 in a direction perpendicular to the length of the sheet 16 so that the next row of lead structures in the sheet of material are ready to be aligned with the bonding position of pedestal 13 as the indexing frame 81 and hence the sheet retaining frame 82 is indexed along the length of the screw shaft 92. The motor 107 accomplishes this indexing by rotating pulley 109 so that the eccentrically mounted roller member 11 bears against the inner periphery 81*a* of the indexing frame 81 so that the entire frame 91 is pivoted about the pivot assembly 98.

Then the second row of lead structures on the sheet of material 16 is bonded one by one to semiconductor bodies as the indexing frame 81 is indexed along the length of the screw shaft 92. Then the indexing frame is returned to its original position and motor 107 is again actuated to index the frame 81 in a perpendicular direction again. This indexing along the row of lead structures and between rows of the lead structures continues until semiconductor bodies are aligned and bonded to each of the lead structures in the sheet of material 16.

Thus, what has been described is an improved bonder and method for bonding a plurality of semiconductor bodies having integrated circuits with contact pads thereon to lead structures a plurality of which are formed in a sheet of material. Manual handling of the semiconductor bodies is minimized and the bonder and method of this invention permit rapid and accurate alignment and bonding of such semiconductor bodies to lead structures.

I claim:

1. A bonder for sequentially bonding a plurality of semiconductor bodies carrying integrated circuits and having a plurality of contact pads thereon to a respective plurality of lead structures formed in rows and columns in a sheet of material comprising: storage means adapted to hold a plurality of the semiconductor bodies; transport means movable between a receiving position adjacent said storage means and a bonding position; pickup arm means adapted to pick up a semiconductor body from said storage means and deposit the semiconductor body on said transport means; a frame adapted to hold the sheet of material with the plurality of lead structures formed therein; indexing means for sequentially indexing said frame whereby the sheet of material is indexed so that each of the lead structures is sequentially positioned in a bonding position approximately coaxially aligned with the bonding position of said transport means; optic means for viewing the one of the lead structures in the bonding position and the transport means and semiconductor body carried thereon in the bonding position thereof; manipulator means for rotating and translating said transport means and hence the semiconductor body carried thereon in order to align the contact pads carried thereon with the lead structure; clamping means for clamping the lead structure to the contact pads of the semiconductor body after alignment therewith; and bonding means for bonding the contact pads of the semiconductor body to the lead structure.

2. A bonder in accordance with claim 1 in which said pickup arm means is manually operated and including additional optic means for viewing a portion of said storage means and said transport means in the receiving position.

3. A bonder in accordance with claim 1 wherein said storage means comprises a rotatable storage disc having an extended lip adapted to hold a plurality of semiconductor bodies.

4. A bonder in accordance with claim 1 including a lower support table and wherein said manipulator means comprises a micropositioner table mounted for sliding movement with respect to said lower support table.

5. A bonder in accordance with claim 4 including a joy stick for controlling movement of said micropositioner table whereby relatively large movements of said joy stick are translated into relatively small movements of said micropositioner table.

6. A bonder in accordance with claim 4 wherein said transport means comprises a transport arm pivotally mounted on said micropositioner table and including motor means for pivoting said transport arm between a transfer position adjacent said storage means and a bonding position.

7. A bonder in accordance with claim 6 including a pedestal mounted to said transport arm for rotation with respect thereto, and including motor means carried by said transport arm for rotating said pedestal.

8. A bonder in accordance with claim 7 wherein said pickup arm means comprises a manually operated vacuum pickup arm for picking up a semiconductor body from said storage means and depositing the semiconductor body on said pedestal while said transport arm is in the transfer position adjacent said storage means.

9. A bonder in accordance with claim 8 wherein said pedestal includes vacuum means for retaining a semiconductor body.

10. A bonder in accordance with claim 8 including a position control operator connected to said joy stick so that movement of said position control operator causes movement of said micropositioner table and hence movement of said transport arm, pedestal and semiconductor body retained thereon whereby contact pads on the semiconductor body can be aligned with a lead structure in the sheet of material.

11. A bonder in accordance with claim 10 wherein said position control operator includes a plurality of pushbuttons for controlling rotation of said pedestal and hence the semiconductor body retained thereon to help align the contact pads on the semiconductor body to the lead structure in the sheet of material.

12. A bonder in accordance with claim 11 wherein said clamping means comprises an L-shaped clamping member having a tapered apertured portion adapted to contact the sheet of material surrounding a lead structure for clamping the lead structure to contact pads of a semiconductor body.

13. A bonder in accordance with claim 12 wherein said bonding means comprises a torch adapted to be moved into a bonding position adjacent the lead structure which is clamped to the semiconductor body contact pads whereby heat is applied to the lead structure and contact pads for forming a bond therebetween.

14. A bonder in accordance with claim 13 wherein said indexing means includes row indexing means for sequentially indexing the sheet of material so that each of the lead structures in a single row are sequentially indexed to a bonding position.

15. A bonder in accordance with claim 14 wherein said indexing means also includes column indexing means for sequentially indexing between rows of lead structures in the sheet of material.

16. A bonder in accordance with claim 14 wherein said row indexing means is controlled to index between successive lead structures by movement of said transport arm from the bonding position to the transfer position.

17. A bonder in accordance with claim 15 wherein said column indexing means is controlled by said row indexing means so that when all of the lead structures in a single row have semiconductor bodies attached thereto the sheet of material is indexed to position another row of lead structures with respect to the bonding position so that said row indexing means sequentially positions each of the lead structures in the other row in the bonding position.

* * * * *